US007952584B2

(12) United States Patent
Sugiyama

(10) Patent No.: US 7,952,584 B2
(45) Date of Patent: May 31, 2011

(54) METHOD OF DISPLAYING DELAY TIME, DEVICE AND STORAGE MEDIUM

(75) Inventor: Hiroyuki Sugiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 693 days.

(21) Appl. No.: 12/028,527

(22) Filed: Feb. 8, 2008

(65) Prior Publication Data

US 2008/0129277 A1 Jun. 5, 2008

(51) Int. Cl.
*G09G 5/22* (2006.01)
(52) U.S. Cl. ................................... 345/440.1
(58) Field of Classification Search .................. 345/440
See application file for complete search history.

(56) References Cited

U.S. PATENT DOCUMENTS

| 3,500,338 | A | * | 3/1970 | Bowman et al. ............... 358/1.1 |
| 3,820,392 | A | * | 6/1974 | Beck et al. ................. 73/861.06 |
| 5,618,744 | A | | 4/1997 | Suzuki et al. |
| 5,787,268 | A | * | 7/1998 | Sugiyama et al. ............... 716/11 |
| 5,889,677 | A | * | 3/1999 | Yasuda et al. ..................... 716/6 |
| 5,892,685 | A | * | 4/1999 | Sugiyama et al. .................. 716/9 |
| 6,035,111 | A | | 3/2000 | Suzuki et al. |
| 6,240,541 | B1 | * | 5/2001 | Yasuda et al. ..................... 716/6 |
| 6,375,309 | B1 | * | 4/2002 | Taneya et al. .................... 347/48 |
| 6,560,763 | B1 | * | 5/2003 | Sugiyama et al. ............... 716/13 |
| 6,684,374 | B2 | * | 1/2004 | Ito et al. ........................... 716/6 |
| 7,616,293 | B2 | * | 11/2009 | Sirota et al. ..................... 356/28 |
| 2006/0122814 | A1 | * | 6/2006 | Beens et al. .................... 702/189 |

FOREIGN PATENT DOCUMENTS

| JP | 2-245879 | 10/1990 |
| JP | 6-275719 | 9/1994 |
| JP | 2004-355065 | 12/2004 |

OTHER PUBLICATIONS

International Search Report mailed Sep. 13, 2005 in connection with the International Application PCT/JP2005/014595.

* cited by examiner

*Primary Examiner* — Javid A Amini
(74) *Attorney, Agent, or Firm* — Staas & Halsey LLP

(57) ABSTRACT

A delay time of a signal delay caused on a path on an electronic circuit is represented as length in a first direction on a plane having as coordinate axes the first direction and a second direction intersecting the first direction. When there is a pin at which a signal is branched on a path, a delay time on the path at and subsequent to that pin is represented as length in the first direction from an origin position that is different from that of the first delay time in the second direction and the same in the first direction.

6 Claims, 16 Drawing Sheets

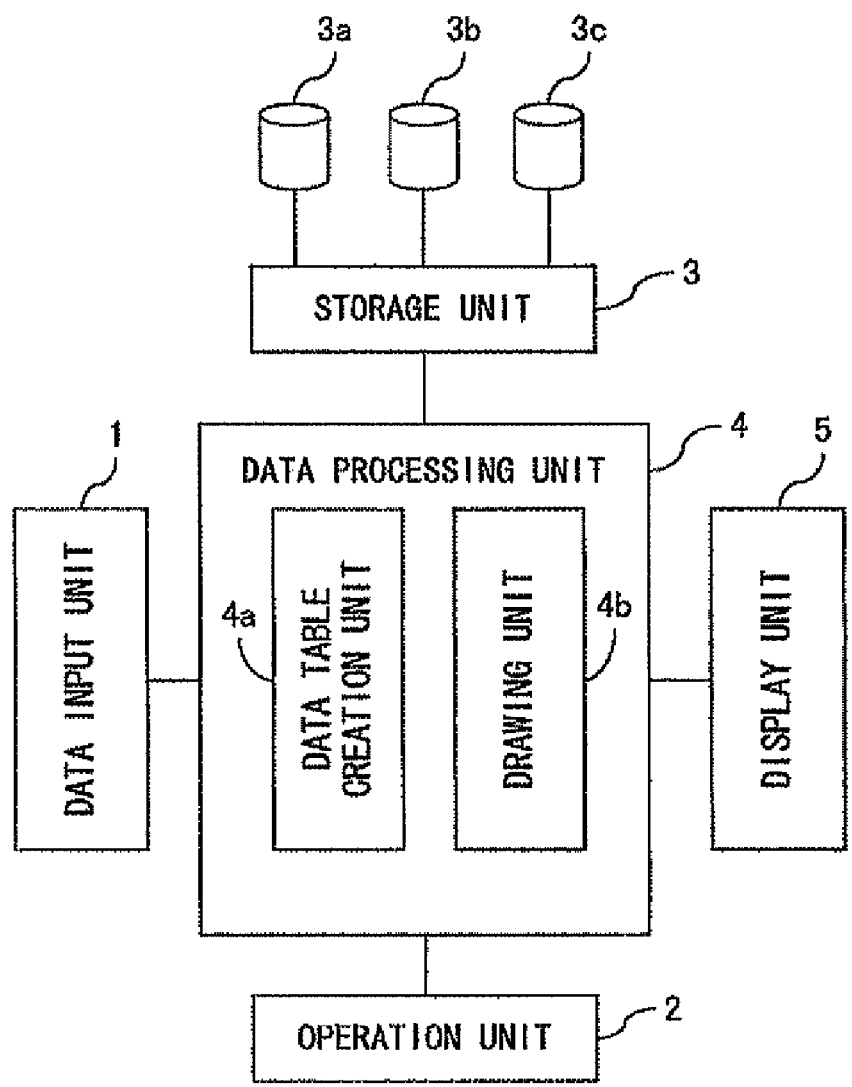
F I G. 1

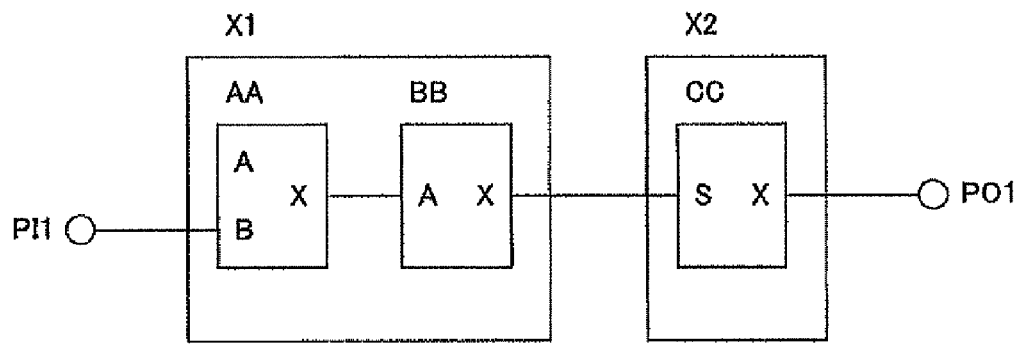
F I G. 4

```
(DELAYFILE
  (SDFVERSION "2.0")
  (DESIGN "")
  (DATE "05/08/03")
  (PROGRAM "T1SDFGEN")
  (VERSION "V01L01")
  (TIMESCALE 0.01 ps)
  (CELL                                              —+
    (CELLTYPE "AAA")                                  |
    (INSTANCE A00)                                    |
    (DELAY                                           |*1
      (ABSOLUTE                                       |
        (INTERCONNECT X1/AA.X X1/BB.A (4196::4196)(4100::4100))   |
        (INTERCONNECT X1/BB.X X2/CC.S (3251::3251)(3289::3289))   |
        (INTERCONNECT .PI1 X1/AA.B (3209::3209)(3221::3221))      |
        (INTERCONNECT X2/CC.X .PO1 (3209::3209)(3221::3221))      |
      )                                               |
    )                                                —+
  )
  (CELL                                              —+
    (CELLTYPE "KOMPX")                                |
    (INSTANCE X1/AA)                                 |*2
    (DELAY                                            |
      (ABSOLUTE                                       |
        (IOPATH (negedge B) X (11923::11923)(9464::9464))   |
        (IOPATH (negedge A) X (11997::11997)(9622::9622))   |
      )                                               |
    )                                                —+
  )
  (CELL                                              —+
    (CELLTYPE "KOMPZ")                                |
    (INSTANCE X1/BB)                                 |*3
    (DELAY                                            |
      (ABSOLUTE                                       |
        (IOPATH (negedge A) X (11997::11997)(9622::9622))   |
      )                                              —+
    )
  )
  (CELL                                              —+
    (CELLTYPE "KO1XM")                                |
    (INSTANCE X2/CC)                                  |
    (DELAY                                           |*4
      (ABSOLUTE                                       |
        (IOPATH (posedge S) X (15025::15025)(14892::14892))   |
        (IOPATH (negedge S) X (14813::14813)(13211::13211))   |
      )                                               |
    )                                                —+
  )
)
```

F I G. 5

| |
|---|
| PIN NAME |
| INTERVAL DELAY |
| INTEGRATED DELAY FROM ORIGIN |
| POINTER TO NEXT STAGE PIN DATA |
| POINTER TO BRANCH PIN DATA |
| POINTER TO PREVIOUS STAGE PIN DATA |
| DISPLAY FLAG |

FIG. 6

| POINTER TO END-POINT PIN |
|---|
| PATH DELAY VALUE |

FIG. 7

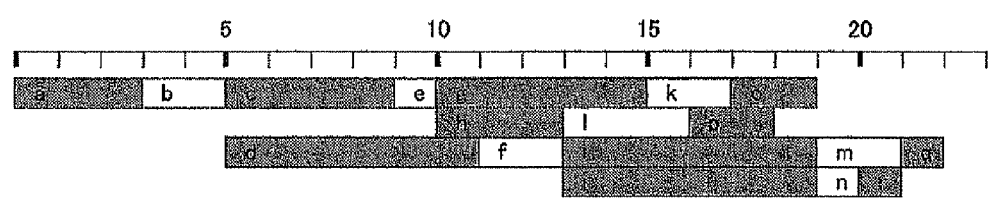
F I G. 10

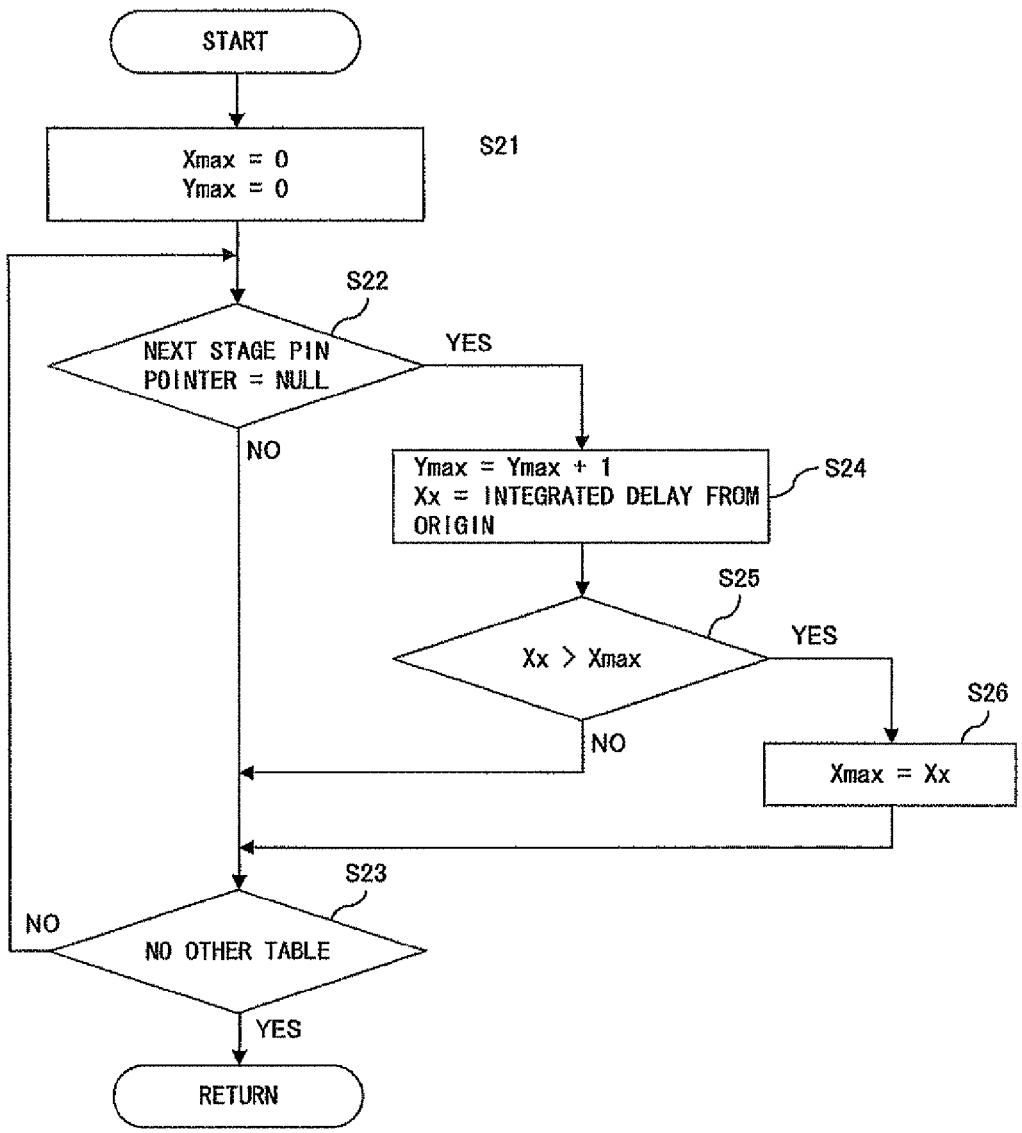
F I G. 1 3

METHOD OF DISPLAYING DELAY TIME, DEVICE AND STORAGE MEDIUM

CROSS REFERENCE TO RELATED APPLICATION

This application is based upon and claims the benefit of priority from the prior International Application No. PCT/JP2005/14595 filed on Aug. 9, 2005, the entire contents of which are incorporated herein by reference.

BACKGROUND OF THE INVENTION

1. Field of the Invention

The present invention relates to a technique of displaying delay times of signals occurring on paths on an electronic circuit that has been designed.

2. Description of the Related Art

In recent years, the demand has increased for the ability to develop electronic circuits such as printed circuit boards (PCBs), integrated circuits, and the like in a shorter time period and at a lower cost. Thus, the importance of the CAD (Computer Aided Design) technique has also been increased because the CAD technique can assist in the development of electronic circuits.

In the CAD technique for electronics, importance is placed on standardization and modeling in order to permit user to perform design even when they do not have a vast knowledge of designing. Elements or components that serve as the functional or logical units for electronic circuits are registered as the fundamental elements (cells) in a library. Usually, fundamental gates such NANDs and NORs; sequential circuits such as flip flop (referred to as FF hereinafter) circuits, counters, and shift registers; memory units; and CPUs are registered as the cells in libraries. Therefore, logical design is performed by selecting the necessary cells from the library and connecting the selected cells to one another. The connections among the cells are realized by connecting the pins of the respective cells. The layout design is performed after performing the logical design.

On an electronic circuit that has been designed, various analyses are performed in order to confirm whether or not the electronic circuit has been appropriately designed. Timing analysis is one of these analyses. Timing analysis is performed in order to check whether or not a failure (such as a malfunction) may be caused by a time difference between the signals transmitted on the paths. Timing analysis includes the setup-time check and the hold-time check. In the setup-time check, it is checked whether or not the timing at which the FF or the like takes in data is too late. In the hold-time check, it is confirmed whether or not the timing at which an FF or the like takes in data is too early. The various analyses including timing analysis can be performed automatically.

The failures detected in the timing analysis have to be removed. For this removal, the design has to be modified. This modification is usually made in such a manner that the time differences are examined for each line between the pins included in the path on which the failure was detected, and at least one line between the pins that is to be adjusted is determined; thereafter, the delay time on the determined line is adjusted. Accordingly, designers have had to perform complicated operations for this adjustment. On the basis of this situation, it can be thought that facilitating design modification is important.

Patent Document 1 discloses a conventional delay time display device that displays delay times existing on the predetermined path. This delay time display device displays delay times caused by the cells being connected to a fixed signal line or by the delay time difference between them. Thereby, the clock distribution circuit using fixed distribution lines is assumed, and the delay time difference (clock skew) between the clock signals distributed by the distribution circuit to the respective paths is easily understood.

The clock distribution circuit is commonly used to provide clock signals to a plurality of pins. However, a failure may occur on the path that is conveying the clock signals provided by the clock distribution circuit. The signals are also provided to at least one pin arranged on a path, and a plurality of connection destinations are set on each pin. Therefore, a great increase in the operation efficiency cannot be expected even when the delay time on a part of the paths is displayed.

For example, in a case where there is a failure of a clock skew between paths that have a section being used in common, the sections that are not being used commonly among the paths have to be modified in order to remove this failure. Accordingly, it is thought that information on the connection relationship between the paths has to be supplied in order to easily achieve high operation efficiency.

Patent Document 1:
Japanese Patent Application Publication No. 6-275719

SUMMARY OF THE INVENTION

It is an object of the present invention to provide a technique of displaying delay times caused on paths together with the connection relationships among the paths.

A delay time display method according to the present invention is a method for displaying a delay time of a signal delay caused on a path on a designed electronic circuit, comprising:

representing the delay time of a signal delay on a path as length in a first direction on a plane having as coordinate axes the first direction and a second direction intersecting the first direction; and representing a delay time on a path at and subsequent to a pin at which the signal is branched on the path as length in the first direction from a position as an origin different in the second direction and the same in the first direction.

It is desirable that the above delay time be represented separately for each line between adjacent pins on the path.

A delay time display device according to a first aspect of the present invention is based on the assumption that the delay time of a signal delay caused on a path on a designed electronic circuit can be displayed, and comprises:

delay time obtainment means obtaining, when there is a pin at which the signal is branched, a first delay time on a path including the pin and a second delay time on a path at and subsequent to the pin as respective delay times on the path; and drawing means assuming a plane having as coordinate axes a first direction and a second direction intersecting the first direction, representing the first delay time as length in the first direction and representing the second delay time as length in the first direction from an origin position that is different from that of the first delay time in the second direction and the same in the first direction.

A delay time display device according to a second aspect of the present invention further comprises in addition to the constituents in the first aspect:

path specifying means specifying a path that is to be a drawing target in the device from among paths on the electronic circuit:

the drawing means performs drawing to represent the delay time on the path specified by the path specifying means.

A storage medium according to the present invention is accessible to a computer to display a delay time of a signal caused on a path on a designed electronic circuit, and stores a program to realize a function, the function comprising:

a function of obtaining, when there is a pin at which the signal is branched, a first delay time on a path including the pin and a second delay time on a path at and subsequent to the pin as respective delay times on the path; and a function of assuming a plane having as coordinate axes a first direction and a second direction intersecting the first direction, representing the first delay time as length in the first direction and representing the second delay time as length in the first direction from an origin position that is different from that of the first delay time in the second direction and the same in the first direction.

In the present invention, a delay time of a signal delay caused on a path on an electronic circuit is represented as length on a first direction on a plane having as coordinate axes the first direction and a second direction perpendicular to the first direction, and when there is a pin at which a signal is branched on a path, the delay time on the path at and subsequent to that pin is represented as length in the first direction from an origin position that is different from that of the first delay time in the second direction and the same first direction.

Because delay times are represented as length in the first direction, the differences between the delay times over paths can be visually recognized easily. Also, a path at and subsequent to the branching pin is represented as length from an origin position that is different from that of the first delay time in the second direction and the same in the first direction; accordingly, delay times on a plurality of branching positions and the portions at and subsequent to the positions (the portions not in common) can be recognized. As a result of this, the modification of design for the timing analysis and failure removal becomes easier for user, and a higher working efficiency is realized easily.

When the delay times are represented separately for each line between adjacent pins, the percentage at which the delay time between the pins affects the entire delay time, the degree of the effect that will be caused when that delay time between the pins is changed, the line between pins involving a delay time that has to be modified, and the like can all be determined easily. Accordingly, user can operate with greater efficiency.

BRIEF DESCRIPTION OF THE DRAWINGS

FIG. 1 shows a configuration of a delay time display device according to the present embodiment;

FIG. 4 shows a first example of an electronic circuit;

FIG. 5 shows an example of the contents of an SDF file used for the exemplary electronic circuit shown in FIG. 4;

FIG. 6 shows a data configuration of a tree table;

FIG. 7 shows a data configuration of a delay table;

FIG. 10 shows a delay tree drawn by the exemplary electronic circuit shown in FIG. 8;

FIG. 13 shows a flowchart for a logical coordination determination process;

DESCRIPTION OF THE EMBODIMENTS

Figure 2:
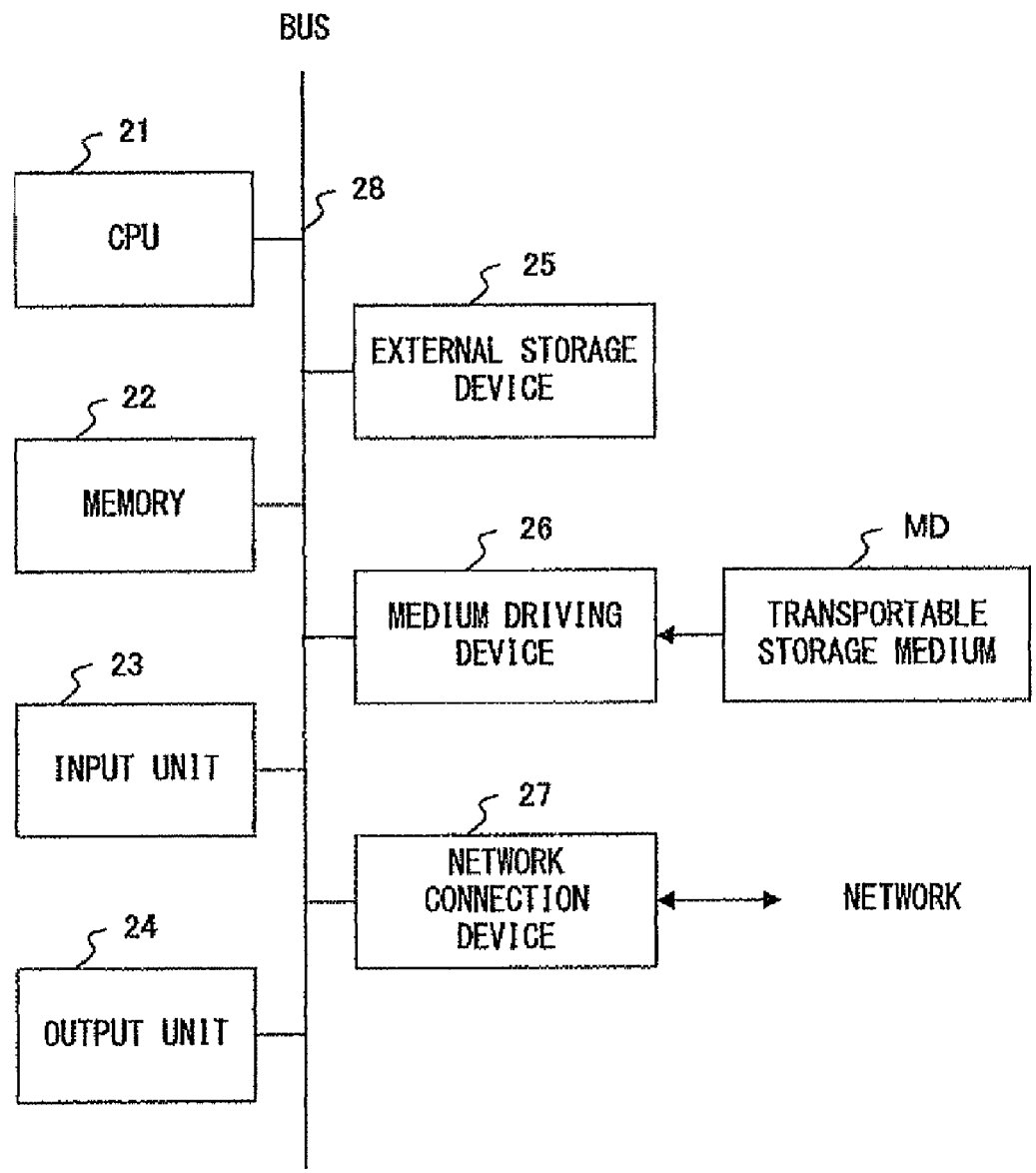
FIG. 2 shows an example of a hardware configuration of a computer that can implement a delay time display device.

Hereinafter, embodiments of the present invention will be explained in detail, referring to the drawings.

FIG. 1 shows a configuration of the delay time display device according to the present embodiment.

A data input unit 1 inputs a data file 3a expressing a designed electronic circuit. In this document, it is assumed that an SDF (Standard Delay Format) file is used as an example of the data file 3a. The SDF file stores the delay times and the connection relationships between the pins. It is also possible to input files such as a library, a net list, and a wire length database instead of the SDF file 3a.

FIG. 4 shows an example of the electronic circuit. FIG. 5 shows an example of the contents of the SDF file used for the exemplary electronic circuit shown in FIG. 4.

"PI1", "X1" and the like in FIG. 4 are instance names for uniquely expressing the pin or cell. The explanation is given by using these symbols for the pins and cells.

In the example of the electronic circuit shown in FIG. 4, cell X1 includes two cells AA and BB, and cell X2 includes cell CC. Pin PI1 is connected to pin B in cell AA, and pin X in cell AA is connected to pin A in cell BB. Pin X in cell BB is connected to pin S in cell CC, and pin X in cell CC is connected to pin PO1.

The connections between the pins or between the pin and the cell are established by using wires (net). In FIG. 5, the connection relationships and the delay times between pin PI1 and pin B in cell AA, pin X in cell AA and pin A in cell BB, pin X in cell BB and pin S in cell CC, and between pin X in cell CC and pin PO1 are described at the portions marked with the symbol "*1". The delay times between pin A in cell AA and pin X, and between pin B and pin X are described at the portions marked "*2". The delay time between pin A in cell BB and pin X is described at the portion marked "*3". The delay time between pin S in the cell CC and pin X is described at the portion marked "*4". Thereby, by referring to the SDF file 3a, the connection relationship between the pins and the delay time between such pins can be determined.

An operation unit 2 receives instructions given by the user (designer). A storage unit 3 stores various pieces of data including the SDF file 3a input through the data input unit 1. A data processing unit 4 creates various tables 3b and 3c used for displaying the delay times, and performs a process of drawing images of the times of signal delays that are caused on the paths. To perform this process, a table creation unit 4a and a drawing unit 4b are provided. A display unit 5 causes a display device to display the image drawn by the data processing unit 4.

FIG. 2 shows an example of a hardware configuration of a computer that can implement the above delay time display device. Although the delay time display device may be implemented by using a plurality of computers (data processing devices), the present embodiment is explained on the assumption that one computer having the configuration of FIG. 2 is used to implement the present invention.

The computer shown in FIG. 2 comprises a CPU 21, a memory unit 22, an input unit 23, an output unit 24, an external storage device 25, a medium driving device 26, and a network connection device 27 in such a manner that they are connected to one another via a bus 28. The configuration shown in FIG. 2 is an example, and the scope of the present invention is not limited to this configuration.

The CPU 21 is a central processing unit for controlling the entirety of the computer.

The memory 22 is a memory unit such as a RAM unit or the like for temporarily storing data, and programs or data stored in a transportable storage medium MD are temporarily stored in the memory 22. The transportable storage medium MD is accessed by the external storage device 25 or the medium driving device 26. The CPU 21 reads the programs into the memory unit 2 to execute the programs, and controls the entirety of the computer.

The input unit 23 is connected to an input device such as a keyboard, a mouse, or the like, or any device contains at least one of such input devices. The input unit 23 detects the operations of the input devices by the user, and transmits the detection results to the CPU 21.

The output unit 24 is connected to, for example a display device, or any device contains the display device. The output unit 24 displays on the display device the data transmitted under the control of the CPU 21.

The network connection device 27 is used for performing communications with external devices via a network such as the intranet, the Internet, or the like. The external storage device 25 is, for example, a hard disk device, and is mainly used for storing various pieces of data and programs.

The medium driving unit 26 accesses a transportable storage medium MD such as a flexible disk, an optical disk (including CD-ROM, CD-R, DVD, and the like), a magneto-optical disk, or the like.

The input unit 1 shown in FIG. 1 is implemented by, for example, the CPU 21, the memory unit 22, the external storage device 25, the medium driving device 26, and the network connection device 57 connected to one another via the bus 28. The operation unit 2 is implemented by, for example, the CPU 21, the memory unit 22, the input unit 23, and the external storage device 25 connected to one another via the bus 28. The storage unit 3 is implemented by, for example, at lease one of the external storage device 25, the medium driving device 26, and the network connection device 27. The data processing unit 4 is implemented by, for example, the CPU 21, the memory unit 22, and the external storage device 25 connected to one another via the bus 28. The display unit 5 is implemented by, for example, the CPU 21, the memory unit 22, the output unit 24, and the external storage device 25 connected to one another via the bus 28.

Figure 3:
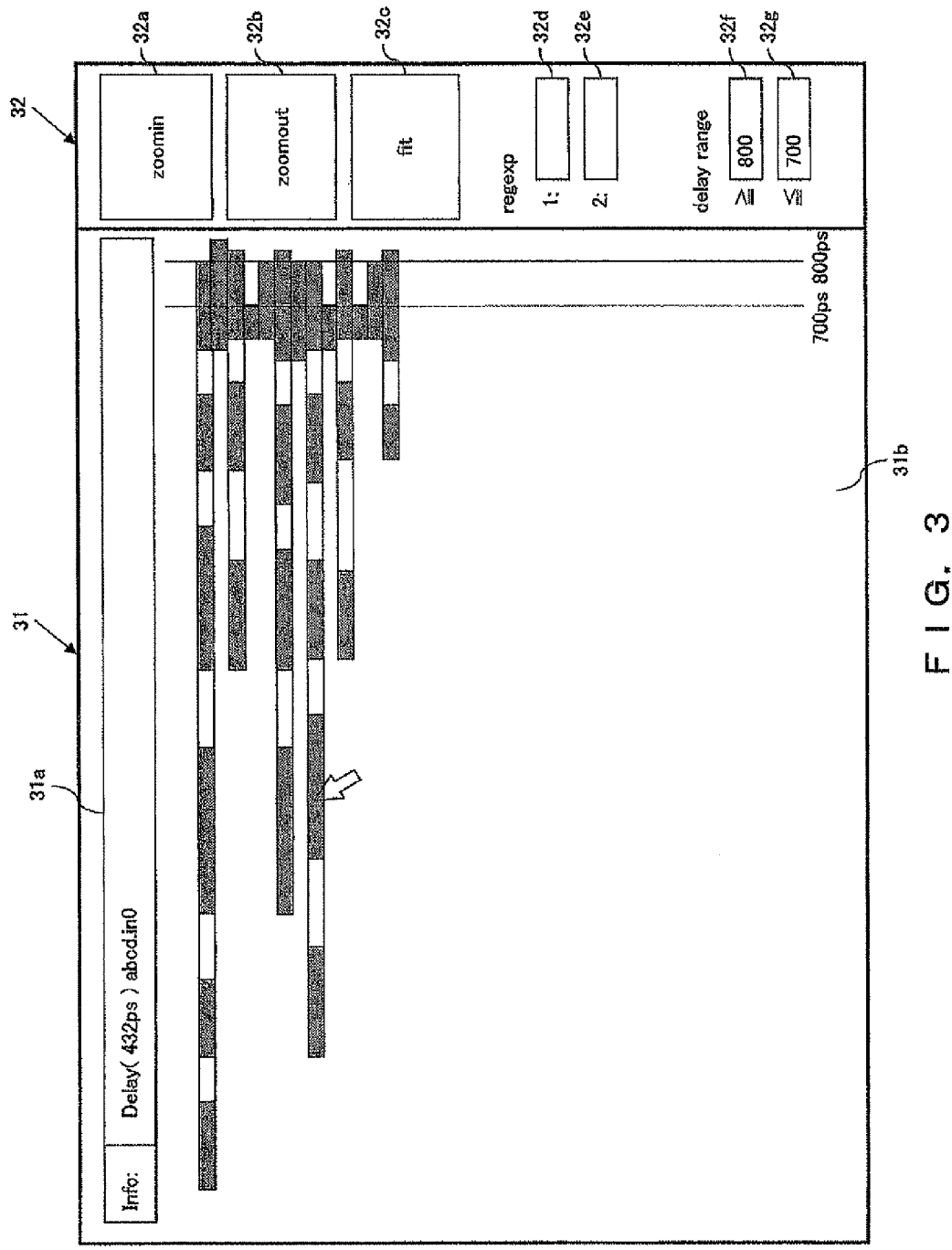
FIG. 3 shows a delay time display window.

On the basis of the SDF file 3a, the data processing unit 4 shown in FIG. 1 draws the delay time display window as shown in FIG. 3, and causes the display unit 5 to display the window on the display device. Here, by referring to FIG. 3, the delay time display window drawn by the data processing unit 4 is explained specifically.

The delay time display window includes an information display area 31 used for displaying pieces of delay time information on the respective paths, and an operation area 32 for receiving various instructions given by the user. The information display area 31 includes a delay information area 31a used for displaying delay information corresponding to the position of the mouse cursor, and a tree display area 31b used for displaying pieces of delay time information on the respective paths in the form of a tree. The operation area 32 includes a "zoom-in" button 32a used to enlarge the displayed information that is being pointed at by the mouse cursor, a "zoom-out" button 32b used to reduce the size of the displayed information that is being pointed at by the mouse cursor, a "fit" button 32c used to make the display of the entire tree an appropriate size, two input boxes 32d and 32e for inputting instance names as the display targets, and two input boxes 32f and 32g for inputting the delay times of the targets. The above tree is referred to as a "delay tree" hereinafter.

As shown in FIG. 3, the delay tree is displayed in the form of a bar graph in which the bars extend in the horizontal direction (X-axis direction) and such bars are arranged in the vertical direction (Y-axis direction). Each bar corresponds to one path, and the length in the vertical direction represents the delay time. In the bar graph, the shaded boxes represent the delay times caused by the wiring (referred to as the "net delay time" hereinafter), and the non-shaded boxes represent the delay times caused by the transmission in the cells (referred to as the "cell delay time" hereinafter). In this configuration, each bar expresses the delay time of one of the constituent elements (cell, wire) that constitute the path. In the delay information area 31a, the name of the instance whose delay time is expressed by the box being pointed at by the mouse cursor, and the delay time on the path corresponding to that position are expressed. In FIG. 3, "abcd.in0" expresses the instance name, and "432 ps" expresses the delay time at the position on the path being pointed at by the mouse cursor.

The bars arranged in the vertical direction have portions for expressing the respective previous situations (the direction that leaves from the operation area 32). The bars arranged in the vertical direction represent the delay times on and subsequent to the branching point of the path (referred to as "branch source path" hereinafter) on which the signals are branched from the path whose delay time is represented by the bar for the previous portion into the plurality of paths (hereinafter, referred to as "branched path"). Thereby, a portion shared by a plurality of paths is represented by a bar for one path, and a portion that is not shared by a plurality of paths is represented on a path-by-path basis. In the present embodiment, the farther from the origin the place where the signal is branched is, the higher the corresponding bar is arranged in the vertical position.

The bars for the branched path are arranged in such a manner that the position of the branching point of the branch source path is used as the origin in order to allow the user to understand from which portion the branch paths start. Thereby, the user can easily understand on which point the respective paths are branched.

As previously described, the respective bars represent the delay time of the entirety together with the delay time for each of the constituent elements on the paths. Thereby, the degree that the respective constituent components affect the delay time of the entirety can be understood easily. The bar graph represents the connection relationships between the paths, and thus the timing analysis that uses the connection relationships can be performed easily. By utilizing the timing analysis, when, for example, a clock skew failure is detected, the area that has to be considered in order to remove the failure can be determined easily. Thereby, an appropriate design modification can be made easily too, which leads to higher operational efficiency.

The delay time display window is drawn by executing the following processes. This drawing of the delay time display window will be explained by referring to FIGS. 6 through 11.

Figure 7:
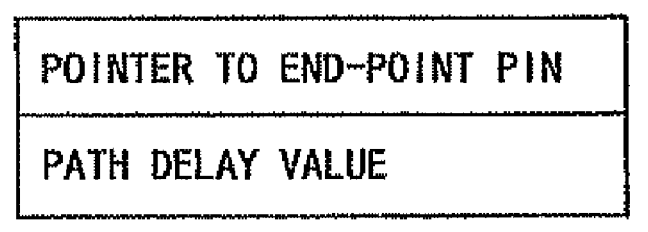

The data processing unit 4 creates the tree table 3b for each pin by referring to the SDF file 3a, and also creates the delay table 3c for each end-point pin by referring to the created tree table 3b. FIG. 6 shows the data configuration of the tree table 3b. FIG. 7 shows the data configuration of the delay table 3c.

The tree table 3b, as shown in FIG. 6, stores, in the form of data, a pin name, a delay time caused while a signal is being output from that pin (this is denoted by "interval delay" in the drawings), an integrated value of a delay time from the origin (this is denoted by "integrated delay from origin" in the drawings), a pointer to the tree table 3*b* of the pin that receives a signal from the corresponding pin (this is denoted by "pointer to next stage pin data" in the drawings), a pointer to the tree table 3*b* for another pin receiving a signal from the corresponding pin (this is denoted by "pointer to branch pin data" in the drawings), a pointer to the tree table 3*b* of a pin receiving a signal (this is denoted by "pointer to previous stage pin data" in the drawings), and a display flag. There are stored the same number of pointers to the branch pin data as the number of branches of the signals. As the end-point pin, zero or NULL is stored as a pointer to the next stage pin data. In this example, the case of NULL is assumed.

Figure 8:
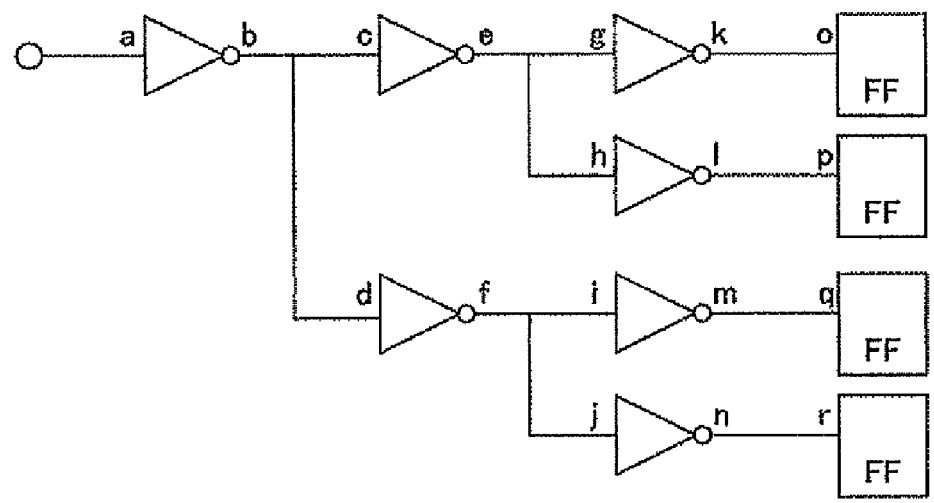
FIG. 8 shows a second example of the electronic circuit.
Figure 9:
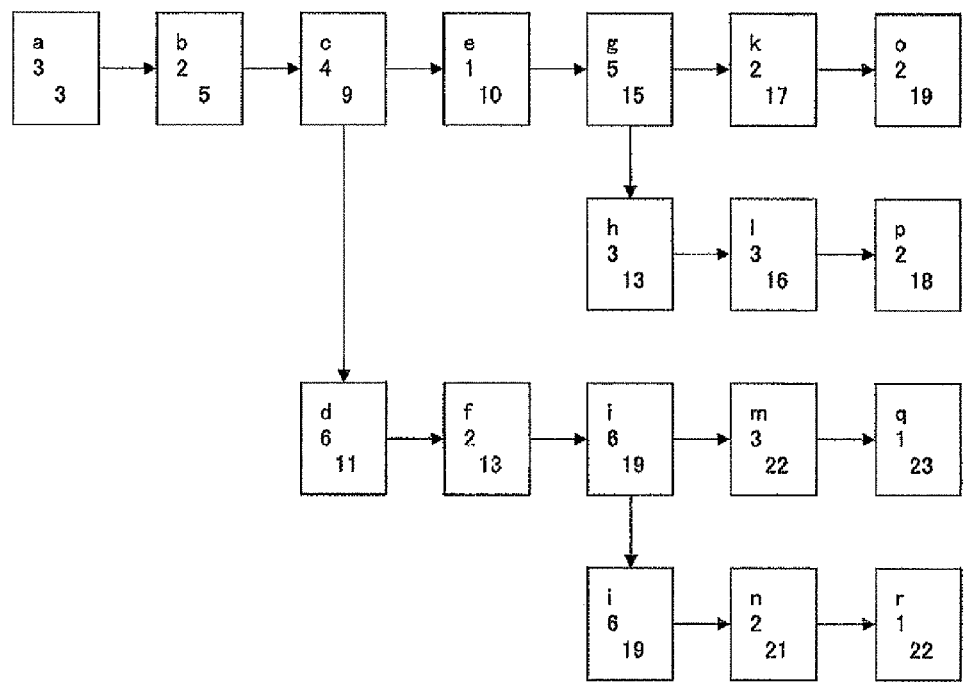
FIG. 9 shows a tree table created by the exemplary electronic circuit shown in FIG. 8.

When the SDF file 3*a* has the content of the exemplary electronic circuit (clock distribution circuit) shown in FIG. 8, a number of tree tables 3*b* are created corresponding to the number of boxes in FIG. 9. In FIG. 9, the boxes containing "a", "3", and "3" represent the tree tables 3*b* in which the pin name is "a", the interval delay is "3", and the integrated delay from the origin is "3". This rule is applied to the other boxes. Also, the boxes containing "o", "p", or "q" represent the tree tables 3*b* of the input pins respectively having four FFs that serve as the end points in the exemplary electronic circuit shown in FIG. 8.

As shown in FIG. 7, the delay table 3*c* created for each end-point pin stores, in the form of data, a pointer to the tree table 3*b* of an end-point pin (this is denoted by "pointer to end-point pin" in the drawings), and a path delay value. The path delay value is data stored, as the integrated delay from the origin, in the tree table 3*b* that is being pointed at by the pointer.

The data table creation unit 4*a* included in the data processing unit 4 creates the above tree table 3*b* and the delay table 3*c*. The tree table 3*b* stores the pointers to the tree tables 3*b* for the pins that output the signals received from the corresponding pins, categorizing them so that there is a group of pointers stored in the next stage pin data and a group of stored in the branch pin data. Thereby, it is possible to discriminate the path running from the origin to the end point and the path that transmits the signals branched from the path, and to determine the pin at which the signal is branched. Thereby, the drawing unit 4*b* draws the delay time display window as shown in FIG. 3 by referring to the tree table 3*b*. When the tree table 3*b* is created from the exemplary electronic circuit shown in FIG. 8, the delay tree is drawn in the tree display area 31*b* as shown in FIG. 10.

The drawing unit 4*b* determines the maximum value (Xmax, Ymax) of the logical coordinate in the tree display area 31*b* as shown below.

Xmax=maximum value of path delay value+α

Ymax=the number of paths (delay table 3*c*)+β

Figure 11:
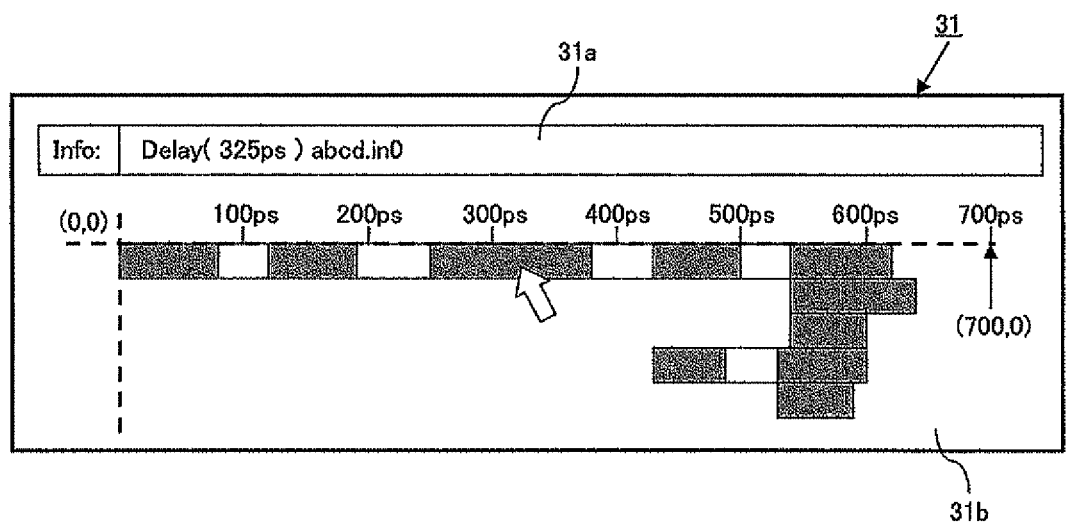
FIG. 11 shows a method for displaying information in response to a position of a mouse cursor in a delay information area.

Due to the above determination, the real coordinate and the logical coordinate can correspond to each other. Accordingly, the coordinate value of the X-axis of the mouse cursor directly represents the delay time, and the coordinate value of the Y-axis directly represents the path. Thereby, the drawing unit 4*b* determines the instance name and the delay time on the path corresponding to the position of the mouse cursor without having to perform a special conversion, and shows these pieces of information in the delay information area 31*a* as shown in FIG. 11.

As shown in FIG. 3, the operation area 32 includes two input boxes 32*d* and 32*e* for specifying, by the instance name, the display target among the delay tables, and two input boxes 32*f* and 32*g* for specifying, by the delay time, the display target among the delay tables. In the present embodiment, the instance name of the end-point pin is input. Thus, when instance names are input in the input boxes 32*d* and 32*e* respectively, the drawing unit 4*b* determines the delay tables 3*c* that store the pin names corresponding to the input instance names, performs tracing in the forward direction starting from the tree table 3*b* being pointed at by the pointer in the delay table 3*c*, and sets, to ON, only the flags in the tree tables 3*b* that have been referred to during this tracing. When a delay time is input in at least one of the input boxes 32*f* and 32*g*, the drawing unit 4*b* determines the delay table 3*c* storing the path delay value corresponding to the delay time that satisfies the conditions specified by the input delay time, and performs tracing in the forward direction starting from the tree table 3*b* specified by the pointer stored in the table 3*c*, and sets, to ON, only the flags in the tree tables 3*b* that have been referred to during this tracing. Thereby, only the delay tables 3*b* in which the display flags are ON are drawn. Thereby, only the delay times on the paths that the user desires to know are drawn.

Hereinafter, the operations of the data processing unit 4 are explained in detail by referring to the flowcharts shown in FIGS. 12 through 16. When the delay time display device in the present embodiment is configured as shown in FIG. 2, the processes represented by the respective flowcharts in FIGS. 12 through 16 are implemented by, for example, the CPU 21 reading into the memory unit 22, and executing, the program stored in the external storage device 25.

Figure 12:
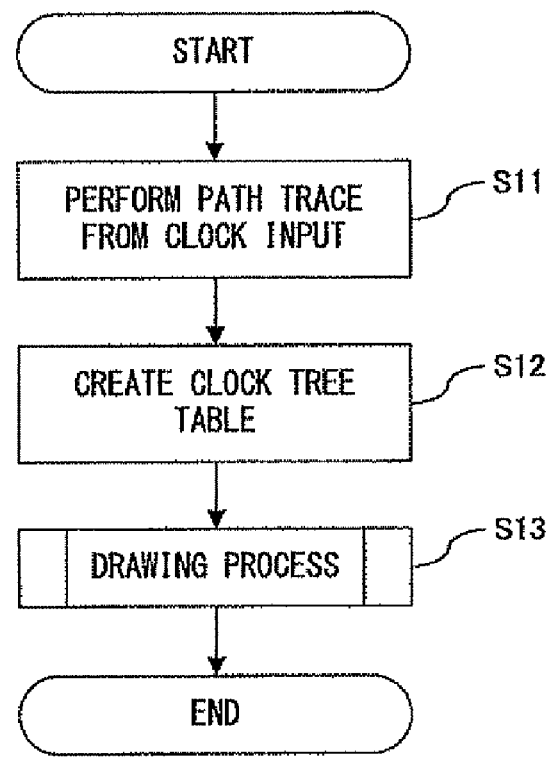
FIG. 12 is a flowchart for the entire process.

FIG. 12 is a flowchart for the entire process. First, the entire process is explained in detail by referring to FIG. 12.

First, in step S11, the forward-path tracing is performed from the origin pin (e.g., the pin to which a clock signal is input) by referring to the SDF file 3*a* specified, and data to be stored in the tree table 3*b* for each pin is collected. In step S12, the tree table (denoted by "clock tree table" in the drawings) 3*b* is created by using the collected pieces of data for each pin. Thereafter, the process proceeds to step S13, and the drawing process is executed for displaying the delay time display window as shown in FIG. 3. Thereafter, this series of processes is terminated.

The SDF file 3*a* is specified depending upon, for example, where the SDF file is stored. Thus, depending upon the place in which the specified SDF file 3*a* is stored, a process for obtaining the SDF file 3*a* may be executed. The operations of the buttons 32*a* through 32*c* arranged on the operation area 32 and the data for input in the input boxes 32*d* through 32*g* correspond to the execution of the drawing process. The flowcharts shown in FIGS. 13 through 16 are flowcharts for the subroutines executed in the drawing process.

FIG. 13 shows a flowchart for the logical coordination determination process. This determination process determines the maximum value (Xmax, Ymax) of the logical coordination for roughly drawing the delay tree in the tree display area 31*b*.

First, in step S21, zero is assigned respectively to the variables Xmax and Ymax. In step S22, it is determined whether or not the pointer to the next stage pin data of the target tree table 3*b* is NULL. When the table 3*b* is of the end-point pin, NULL is stored as the pointer in that table 3*b*, and accordingly, the determination result is YES, and the process proceeds to step S24. In cases other than the above, the determination result is NO, and the process proceeds to step S23.

In step S23, it is determined whether or not there is a tree table 3*b* that is to be the next target. When there is not a table 3*b* that is to be the next target, the determination result is YES, and a series of the processes is terminated after updating the variables Xmax and Ymax for the purpose of having margins. In cases other than the above, the determination result is NO, and the process returns to the above step S22, and one of the remaining tree tables 3b is selected to be the target tree table for performing the determination process for that table.

In step S24 executed when the determination result in step S22 is YES, the value of the variable Ymax is incremented, and the integrated delay from the target tree table 3b is assigned to the variable Xx. In step S25, it is determined whether or not the value of the variable Xx is greater than the value of the variable Xmax. When this relationship between the values is satisfied, the determination result is YES, and the value of the variable Xx is assigned to the variable Xmax in step S26. Thereafter, the process proceeds to step S23. If this relationship is not satisfied, the determination result is NO, and the process proceeds to step S23 without executing any other processes.

Figure 14:
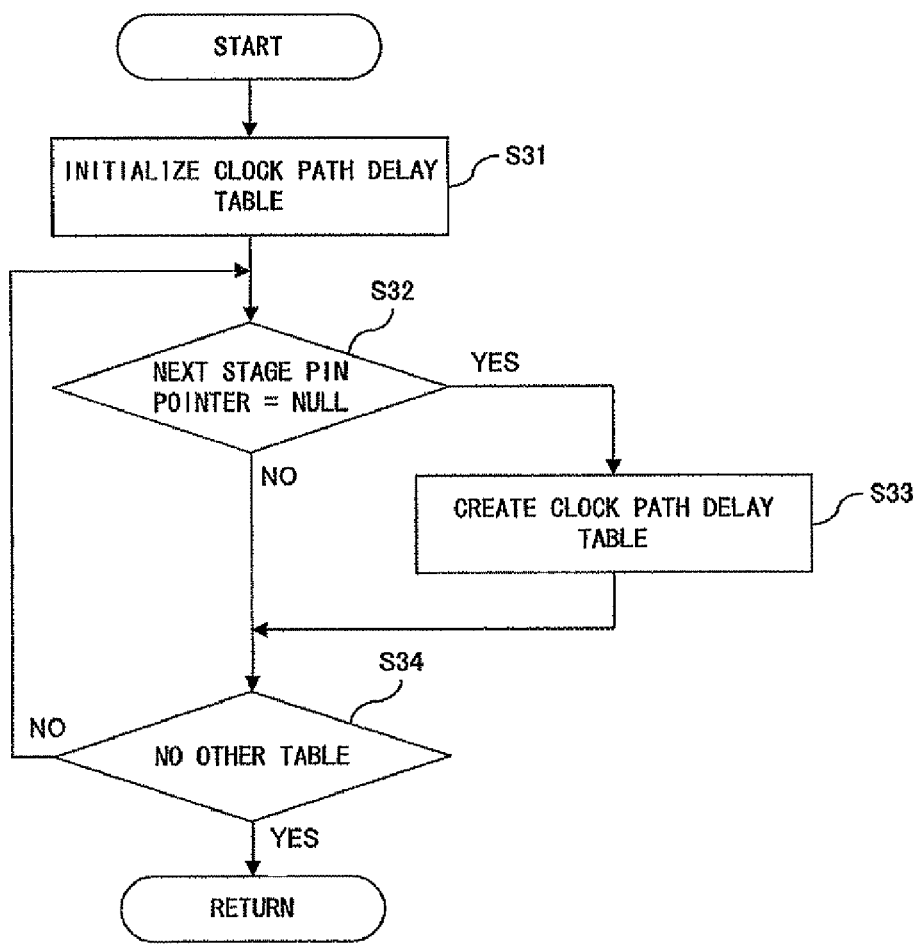
FIG. 14 is a flowchart for a delay table creation process.

FIG. 14 is a flow chart for the delay table creation process. This process will be explained in detail by referring to FIG. 14.

First, in step S31, the delay table 3c (denoted by "clock path delay table" in the drawings) is initialized. In step S32, it is determined whether or not the pointer to the next stage pin data in the target tree table 3b is NULL. When that table 3b is of the end-point pin, NULL is held as the pointer to that pin. Thus, the determination result is YES, and the process proceeds to step S33. If the above table 3b is not of the end-point pin, the determination result is NO, and the process proceeds to step S34.

In step S33, a delay table 3c storing a pointer to the target tree table 3b and the integrated delay from that table 3b is created. In step S34 to be executed thereafter, it is determined whether or not there is a tree table 3b that has to be the next target. When there are no more tables 3b to be the next target, the determination result is YES, and the series of processes is terminated. Where there is at least one more table to be the next target, the determination result is NO, and the process returns to step S32 above, one of the remaining tree tables 3b is selected to be the target tree table 3b, and the determination process is executed on that tree table 3b.

The subroutines whose flowcharts are shown in FIGS. 13 and 14 are executed before the first delay time displaying window is drawn. Thereby, the delay tree is appropriately drawn in the tree display area 31b.

Figure 15:
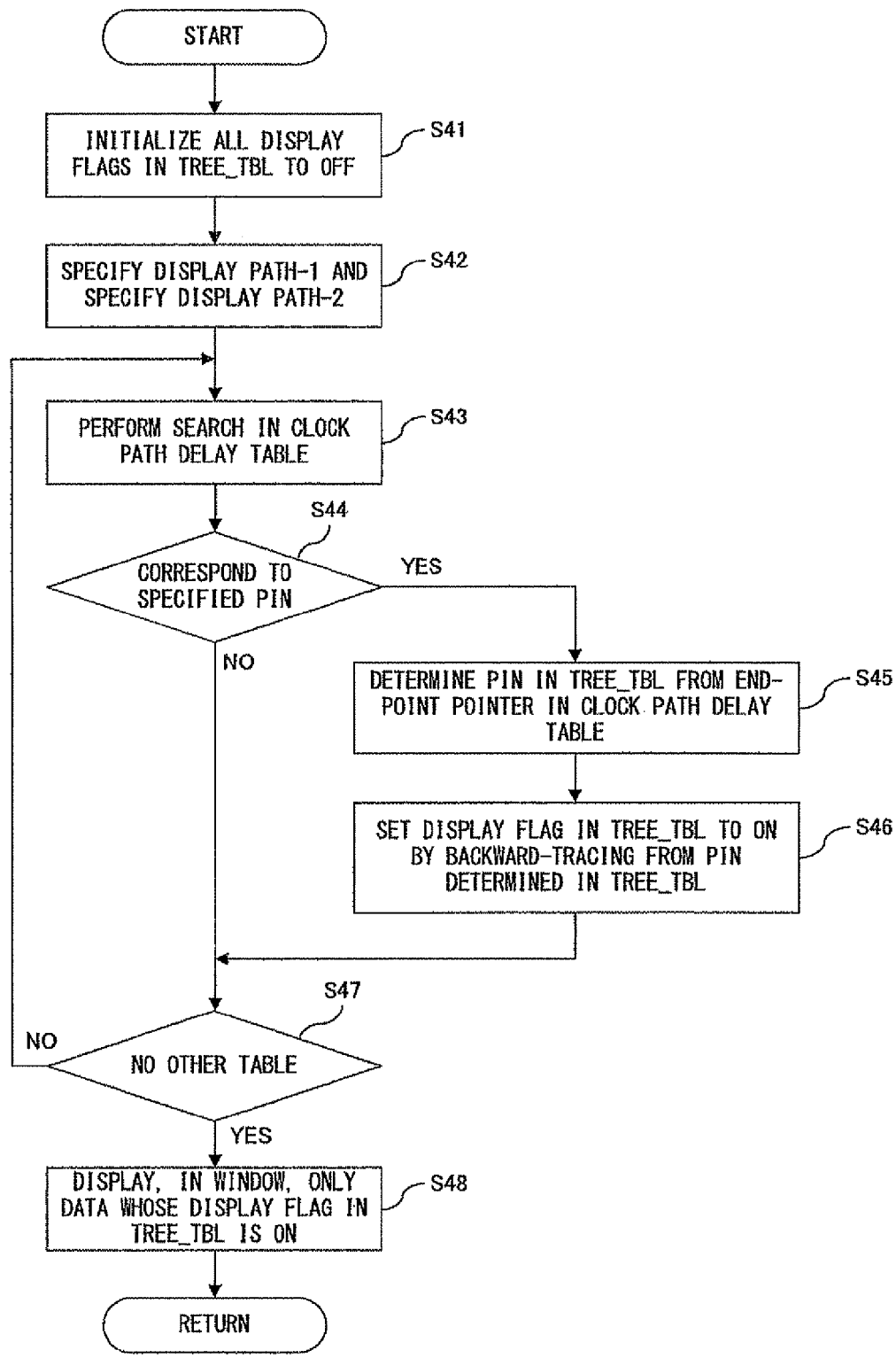
FIG. 15 is a flowchart for a path selection process that uses instance names.

FIG. 15 is a flowchart for the path selection process that uses instance names. This selection process is executed when the user input instance names into the input boxes 32d and 32e. In the present embodiment, the instance names (or canonical representation) specifying the end-point pins to be used for the confirmation of the clock skew are input.

First, in step S41, all the display flags in the tree tables 3b are initialized to OFF. In step S42, the paths are specified in which the end-point pins are the instance names that have been input into the input boxes 32d and 32e as the display path-1 and the display path-2. In step S43, a search is performed in order to extract one display table 3c. After this extraction, the process proceeds to step S44.

In step S44, it is determined whether or not the pin name of the tree table 3b being pointed at by the pointer in the extracted delay table 3c is a table specified by one of the instance names input into the input boxes 32d and 32e. When the pin name is the one that has been specified by the user, the determination result is YES, and the process proceeds to step S45. Otherwise, the determination result is NO, and the process proceeds to step S47.

In step S45, the pin having the pin name of the tree table 3b being pointed at by the pointer in the extracted delay table 3c is determined to be the origin for tracing. In step S46, the back tracing is performed from that pin, and the display flags in the tree tables 3b that have been referred to while that tracing was being performed are set to ON. Thereafter, the process proceeds to step S47.

In step S47, it is determined whether or not there are other delay tables that have to be extracted. When there are such tables, the determination result is NO, and the process returns to the above step S43 for extracting the tables 3c. When there is not such a table, the determination result is YES, and the process proceeds to step S48, and the delay tree corresponding only to the tree tables 3b whose display flags are ON are drawn and displayed. Thereafter, the series of the processes is terminated.

The tree table 3b whose display flag is ON is for the pin constituting at least one of the two paths that have, as the end-point pins, the instance names input into the input boxes 32d and 32e by the user. Accordingly, the delay tree that represents the delay times of the two paths is displayed on the tree display area 31b.

Figure 16:
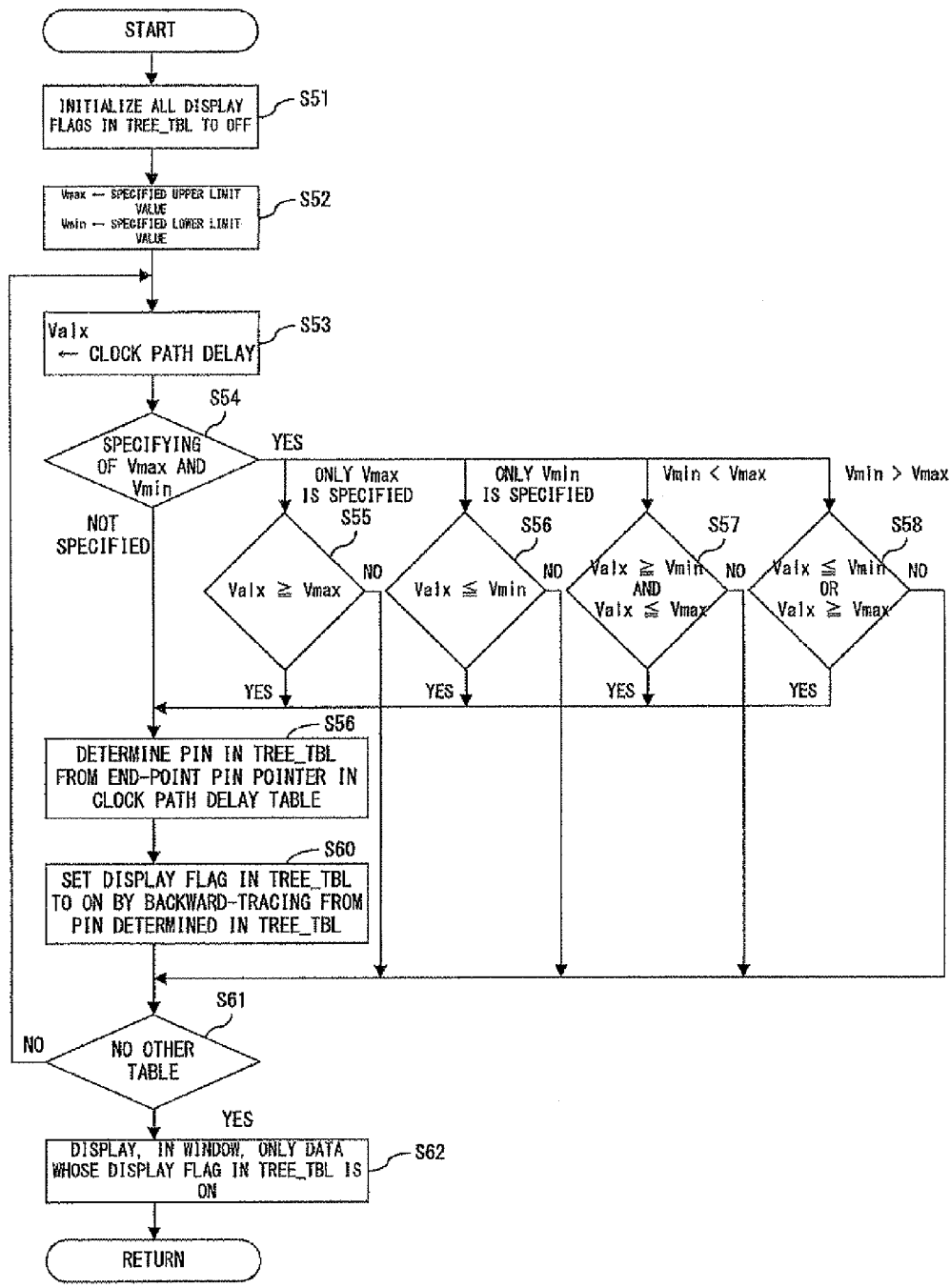
FIG. 16 is a flowchart for a path selection process based on delay times.

FIG. 16 is a flowchart for the path delay selection process based on the delay times. This selection process is executed when the user has input the delay time into at least one of the input boxes 32f and 32g.

First, in step S51, all the display flags in the tree tables 3b are initialized to OFF. In step S52, the delay times input into the input boxes 32f and 32g are respectively assigned to the variables Vmax and Vmin. In step S53 to be executed next, the path delay value (denoted by "clock path delay" in the drawings) in the target delay table 3d that is among the delay tables 3d is assigned to the variable Valx. In the drawings, the delay that has been input into the input box 32f is denoted as "specified upper limit value", and the delay time that has been input into the input box 32g is denoted as "specified lower limit value".

In step S54 subsequent to step S53, the specified contents as the variables Vmax and Vmin are checked. When nothing is specified, i.e., when a delay time is input into neither the input boxes 32f nor 32g, the process proceeds to step S59. Thereby, all the paths become the targets of display. When a delay time has been input into at least one of the input boxes 32f and 32g, the relationship between the input box in which the delay time has been input and that delay time is determined, and the processes in accordance with the relationship are executed.

When a delay time has been input only into the input box 32f, the process proceeds to step S55, and it is determined whether or not the value of the variable Valx is equal to or greater than the variable Vmax. When the variable Valx is equal to or greater than the variable Vmax, the determination result is YES, and the process proceeds to step S59. When the variable Valx is not equal to or greater than the variable Vmax, the determination result is NO, and the process proceeds to step 61. Thereby, the paths having path delay values in the delay tables 3c equal to or greater than Vmax become the targets to be displayed.

When a delay time has been input only in the input box 32g, this status is detected in step S54. Thereafter, in step S56, it is determined whether or not the variable Valx is equal to or smaller than the variable Vmax. When the variable Valx is equal to or smaller than the variable Vmax, the determination result is YES, and the process proceeds to step S59. When the variable Valx is not equal to or smaller than the variable Vmax, the determination result is NO, and the process proceeds to step S61. Thereby, the paths having path delay values in the delay tables 3c equal to or smaller than Vmax become the targets to be displayed.

When a delay time smaller than the delay time in the input box 32g has been input into the input box 32f, this status is detected in step S54, and in step S57, it is determined whether or not the variable Valx is equal to or greater than the variable Vmin and is equal to or smaller than the variable Vmax. When the variable Valx is within the range specified by the variables Vmin and Vmax, the determination result is YES, and the process proceeds to step S59. When the variable Valx is not within the range specified by the variables Vmin and Vmax, the determination result is NO, and the process proceeds to step S61. Thereby, the paths having the path delay values in the delay tables 3c within the range specified by the variables Vmin and Vmax become the targets to be displayed (FIG. 3).

When a delay time greater than the delay time in the input box 32g has been input into the input box 32f, this status is detected in step S54, and the process proceeds to step S58. Thereafter, it is determined whether or not the variable Valx is equal to or smaller than the variable Vmin or is equal to or greater than the variable Vmax. When the variable Valx is equal to or smaller than the variable Vmin, or is equal to or greater than the variable Vmax, the determination result is YES, and the process proceeds to step S59. When none of the above conditions is satisfied, the determination result is NO, and the process proceeds to step S61. Thereby, the paths having path delay values in the delay tables 3c that are equal to or smaller than the variable Vmin or that are equal to or greater than the variable Vmax become the targets to be displayed.

In step S59, the pin having the pin name of the tree table 3b being pointed at by the pointer in the delay table 3c in which the path delay value was assigned to the variable Valx in step S54 is determined as the origin for tracing. In step S60, backward tracing is performed from that pin, and the display flags in the tree tables 3b that have been referred to in the tracing are set to ON. Thereafter, the process proceeds to step S61.

In step S61, it is determined whether or not there remains a delay table 3c that has to be the target. When such a table remains, the determination result is NO, and the process proceeds to the above step S53, and the path delay value is assigned to a variable Valx for a new table 3c to be the target. When such a table does not remain, the determination result is YES, the process proceeds to step S62, then the tree of the tree tables 3b whose display flags are in an ON state are drawn and displayed. Thereafter, the series of processes is terminated.

When a user has input a delay time into at least one of the input boxes 32f and 32g, the display flags only in the tree tables 3b of the pins constituting the path that satisfies the conditions specified by the input delay time are set to ON. When a delay time has not been input into the input boxes 32f or 32g, it is considered that all the paths satisfy the conditions, and all the flags in the tree tables 3b are set to ON. Thereby, it is possible to specify various conditions by changing the manner of inputting delay times in the input boxes 32f and 32g.

In the present embodiment, the bars in the delay tree are arranged in the vertical direction (on the Y-axis) depending on the point at which signals are branched. However, the bars may be arranged in the vertical direction depending on other factors. For example, the bars may be vertically arranged depending on the delay times (the path delay value in the delay table 3c) on the entire path. It is also possible to prepare a plurality of options to be selected by the user.

A part or a whole of the program for implementing the above described delay time display device or the variations thereof may be distributed in the form of the external storage device 25, and also may be distributed in the form of the storage medium MD that the medium driving device 26 can access. Also, this program may be distributed via communications media that constitute communications networks.

What is claimed is:

1. A method for displaying a delay time of a signal delay caused on a path on a designed electronic circuit, comprising:
representing by a computer the delay time of a signal delay on the path as length in a first direction representing the delay time on the path on a plane having as coordinate axes the first direction and a second direction intersecting the first direction and representing paths including the path and a branched path which is branched at and subsequent to a pin on the path; and
representing by the computer a delay time on the branched path at and subsequent to the pin at which the signal is branched on the path as length in the first direction from an origin position that is different from a branching point of the pin on the path represented as the delay time in the second direction and the same in the first direction.

2. The method for displaying a delay time according to claim 1, wherein: the delay time is represented separately for each line between adjacent pins on the path.

3. A delay time display device for displaying a delay time of a signal delay caused on a path on a designed electronic circuit, comprising:
delay time obtainment means obtaining, when there is a pin at which the signal is branched, a first delay time on the path including the pin and a second delay time on a branched path which is branched at and subsequent to the pin as respective delay times on the path; and
drawing means assuming a plane having as coordinate axes a first direction representing the delay time on the path and a second direction intersecting the first direction and representing respective paths including the path and the branched path which is branched at and subsequent to the pin on the path, representing the first delay time as length in the first direction, and representing the second delay time as length in the first direction from an origin position that is different from a branching point of the pin on the path represented as the delay time in the second direction and the same in the first direction.

4. The delay time display device according to claim 3, wherein: the drawing means draws the first and second delay times separately for each line between adjacent pins on the path.

5. The delay time display device according to claim 3, further comprising: path specifying means specifying a path that is to be a drawing target from among paths on the electronic circuit,
wherein: the drawing means performs drawing to represent the delay time on the path specified by the path specifying means.

6. A storage medium which can be accessed by a computer that can be used to display a delay time of a signal caused on a path on a designed electronic circuit, and stores a program that when executed causes the computer to perform a method comprising:
obtaining, when there is a pin at which the signal is branched, a first delay time on the path including the pin and a second delay time on a branched path which is branched at and subsequent to the pin respectively as delay times on the path; and
assuming a plane having as coordinate axes a first direction representing the delay time on the path and a second direction intersecting the first direction and representing respective paths including the path and the branched path which is branched at and subsequent to the pin on the path, representing the first delay time as length in the first direction, and representing the second delay time as length in the first direction from an origin position that is different from a branching point of the pin on the path represented as the delay time in the second direction and the same in the first direction.

* * * * *